(12) United States Patent
Wagenleitner et al.

(10) Patent No.: US 11,059,280 B2
(45) Date of Patent: Jul. 13, 2021

(54) DEVICE AND METHOD FOR BONDING SUBSTRATES

(71) Applicant: EV Group E. Thallner GmbH, St. Florian am Inn (AT)

(72) Inventors: Thomas Wagenleitner, Aurolzmunster (AT); Markus Wimplinger, Ried im Innkreis (AT); Friedrich Paul Lindner, Scharding (AT); Thomas Plach, Linz (AT); Florian Kurz, Taufkirchen an der Pram (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 16/356,325

(22) Filed: Mar. 18, 2019

(65) Prior Publication Data
US 2019/0210348 A1 Jul. 11, 2019

Related U.S. Application Data

(62) Division of application No. 14/419,664, filed as application No. PCT/EP2013/061086 on May 29, 2013, now Pat. No. 10,279,575.

(51) Int. Cl.
*B32B 38/18* (2006.01)
*H01L 21/18* (2006.01)
(Continued)

(52) U.S. Cl.
CPC ...... *B32B 38/1833* (2013.01); *B32B 37/0076* (2013.01); *H01L 21/187* (2013.01);
(Continued)

(58) Field of Classification Search
CPC ......... H01L 21/67092; H01L 21/67103; H01L 21/67098; H01L 21/187; H01L 21/683;
(Continued)

(56) References Cited

U.S. PATENT DOCUMENTS

| 4,752,180 A | 6/1988 | Yoshikawa |
| 5,129,827 A | 7/1992 | Hoshi et al. |

(Continued)

FOREIGN PATENT DOCUMENTS

| CN | 102315149 A | 1/2012 |
| EP | 0 256 150 A1 | 2/1988 |

(Continued)

OTHER PUBLICATIONS

International Search Report from corresponding International Patent Application No. PCT/EP2013/061086, dated May 29, 2013 (English-language translation provided.

(Continued)

*Primary Examiner* — Philip C Tucker
*Assistant Examiner* — Brian R Slawski
(74) *Attorney, Agent, or Firm* — Kusner & Jaffe (57) ABSTRACT

A method for bonding a contact surface of a first substrate to a contact surface of a second substrate comprising of the steps of: positioning the first substrate on a first receiving surface of a first receiving apparatus and positioning the second substrate on a second receiving surface of a second receiving apparatus; establishing contact of the contact surfaces at a bond initiation site; and bonding the first substrate to the second substrate along a bonding wave which is travelling from the bond initiation site to the side edges of the substrates, wherein the first substrate and/or the second substrate is/are deformed for alignment of the contact surfaces.

7 Claims, 5 Drawing Sheets

(51) Int. Cl.

| | |
|---|---|
| *B32B 37/00* | (2006.01) |
| *B32B 37/18* | (2006.01) |
| *B32B 37/10* | (2006.01) |
| *B29C 65/78* | (2006.01) |
| *H01L 21/67* | (2006.01) |
| *H01L 21/683* | (2006.01) |
| *B29C 65/00* | (2006.01) |

(52) U.S. Cl.
CPC ........ *B29C 65/002* (2013.01); *B29C 65/7802* (2013.01); *B29C 66/452* (2013.01); *B29C 66/73141* (2013.01); *B32B 37/10* (2013.01); *B32B 37/18* (2013.01); *B32B 38/1866* (2013.01); *B32B 2457/14* (2013.01); *H01L 21/67092* (2013.01); *H01L 21/683* (2013.01); *Y10T 156/17* (2015.01)

(58) Field of Classification Search
CPC ............. H01L 21/6831; H01L 21/6838; H01L 2224/94; H01L 2224/80; B32B 2457/14; B32B 38/1825; B32B 38/1833; B32B 38/1866; B32B 37/18; B32B 37/0046; B32B 37/04; B32B 37/10; B32B 2037/0092; B32B 37/0076; B29C 65/00; B29C 65/002; B29C 65/78; B29C 65/7802; B29C 65/7841; B29C 66/40; B29C 66/41; B29C 66/45; B29C 66/452; B29C 66/73141; Y10T 156/17
USPC ... 156/60, 64, 160, 163, 182, 196, 212, 229, 156/290, 306.3, 308.2, 308.4, 309.6, 349, 156/443, 475, 476, 494, 538, 539, 556, 156/580, 581, 583.1; 438/455, 457
See application file for complete search history.

(56) References Cited

U.S. PATENT DOCUMENTS

| | | | |
|---|---|---|---|
| 5,273,553 A | | 12/1993 | Hoshi et al. |
| 5,447,596 A | * | 9/1995 | Hayase ............... H01L 21/6835 156/701 |
| 8,575,002 B2 | | 11/2013 | Broekaart et al. |
| 9,004,135 B2 | | 4/2015 | Castex et al. |
| 2005/0173057 A1 | | 8/2005 | Suga et al. |
| 2006/0141742 A1 | | 6/2006 | Fournel et al. |
| 2007/0087531 A1 | | 4/2007 | Kirk et al. |
| 2009/0186560 A1 | | 7/2009 | Kordic |
| 2010/0122762 A1 | | 5/2010 | George |
| 2012/0006463 A1 | | 1/2012 | Gaudin |
| 2012/0077329 A1 | | 3/2012 | Broekaart et al. |
| 2012/0088350 A1 | | 4/2012 | Kerdiles et al. |
| 2012/0193009 A1 | | 8/2012 | Fujii |
| 2012/0247645 A1 | | 10/2012 | Tsutsumi et al. |
| 2012/0329241 A1 | * | 12/2012 | Yamaguchi ....... H01L 21/76251 438/455 |
| 2014/0072774 A1 | * | 3/2014 | Kito .................. H01L 21/67092 428/174 |
| 2014/0227884 A1 | * | 8/2014 | Engesser ............. H01L 21/6708 438/747 |

FOREIGN PATENT DOCUMENTS

| | | | |
|---|---|---|---|
| EP | 0 415 340 | A1 | 3/1991 |
| EP | 2 405 465 | A1 | 1/2012 |
| JP | S61-185916 | A | 8/1986 |
| JP | H07-66093 | A | 3/1995 |
| JP | H08-323572 | A | 12/1996 |
| JP | 2001-210704 | A | 8/2001 |
| JP | 2009-010072 | A | 1/2009 |
| JP | 2011-114278 | A | 6/2011 |
| JP | 2011-216832 | A | 10/2011 |
| JP | 2012-019209 | A | 1/2012 |
| JP | 2012-069917 | A | 4/2012 |
| JP | 2013-531395 | A | 8/2013 |
| TW | 201340248 | A | 10/2013 |
| WO | WO-2012/010517 | A1 | 1/2012 |
| WO | WO-2012/083978 | A1 | 6/2012 |
| WO | WO-2012147343 | A1 * | 11/2012 ....... H01L 21/67288 |
| WO | WO-2013/058052 | A1 | 4/2013 |

OTHER PUBLICATIONS

Mack, Chris, "Fundamental Principles of Optical Lithography: The Science of Microfabrication," Wiley, 2008 (Description only).
Non-final Office Action issued in corresponding U.S. Appl. No. 14/419,664 dated Mar. 9, 2017.
Final Office Action issued in corresponding U.S. Appl. No. 14/419,664 dated Aug. 24, 2017.
Non-final Office Action issued in corresponding U.S. Appl. No. 14/419,664 dated Jan. 30, 2018.
Final Office Action issued in corresponding U.S. Appl. No. 14/419,664 dated Jun. 29, 2018.

* cited by examiner

DEVICE AND METHOD FOR BONDING SUBSTRATES

RELATED APPLICATIONS

This application is a division of U.S. application Ser. No. 14/419,664, filed Feb. 5, 2015, which is a U.S. National Stage Application of International Application No. PCT/EP2013/061086, filed May 29, 2013, said patent applications hereby fully incorporated herein by reference.

FIELD OF THE INVENTION

This invention relates to a method for bonding of a first substrate to a second substrate.

BACKGROUND OF THE INVENTION

Advancing miniaturization in almost all fields of microelectronics and microsystems engineering provides for a continuing development of all technologies by which the density of all type of functional units on substrates can increase. These functional units include, for example, microcontrollers, memory components, MEMS, all type of sensors or microfluid components.

Techniques for increasing the lateral density of these functional units have greatly improved in recent years. In some branches of microelectronics or microsystems engineering, the improvement is to a point that a further increase of the lateral density of the functional units is no longer possible. In microchip production, the maximum possible resolution limit for structures that are produced lithographically has been achieved. In a few years, physical or technological limitations will no longer allow any increase in the lateral density of functional units. The industry has been addressing this problem for some years by the development of 2.5D and 3D technologies. Using these technologies, it is possible to align the same or even different types of functional units to one another, stack them on top of one another, join them permanently to one another and to network them to one another by corresponding printed circuits.

One of the key technologies for the implementation of these structures is permanent bonding. Permanent bonding is defined as all methods by which substrates can be joined to one another such that they can be separated only by high energy expenditure and an associated destruction of the substrates. There are different types of permanent bonding.

One of the most important permanent bonding methods is fusion bonding, also called direct bonding or molecular bonding. Fusion bonding is defined as the process of permanently joining two substrates via the formation of covalent connections. Fusion bonds form mainly on the surface of nonmetallic-inorganic materials.

Basically, a distinction should be made between a prebond and the actual permanent bond. A prebond is defined as a connection of surfaces which forms spontaneously when two surfaces are in contact; their bonding strength is smaller than the bonding strength of the permanent bond, which is produced by a subsequent heat treatment. The bond strength caused by the prebond is. However, sufficient to transport the two substrates without causing a shift of the substrates relative to one another. Although the bond strength between the two substrates is sufficient to easily transport the substrate stack, the bond strength is so low that a repeated, nondestructive separation of the two substrates can take place with special devices. This has the major advantage that after a prebond, the structures of the two structures can be measured and their relative positions, distortions and orientations can be determined. If it is established during the measurement process that a faulty orientation and/or a local and/or global distortion of the structures is present, or there are particles in the interface, the substrate stack can be accordingly separated again and reprocessed. After a successful and verified prebond, a permanent bond is produced by heat treatment processes. During the heat treatment process, a chemical and/or physical strengthening of the connection of the surfaces of the two substrates occurs by the supply of thermal energy. This permanent bond is irreversible in the sense that a nondestructive separation of the two substrates is no longer possible. Subsequently, it can no longer be explicitly distinguished between prebond and permanent bond, but in general there is only a bond.

The most common fusion bonds are carried out on silicon and silicon oxide substrates. Silicon is used due to its semiconductor properties as a base material for the production of microelectronic components such as microchips and memories. A so-called direct bond can also form between highly polished metal surfaces. The underlying bonding properties differ from those of a fusion bond, the mechanism with which the two surfaces can make contact with one another by an advancing bonding wave, but can also be described by the same physics. The joining of two hybrid surfaces by a so-called hybrid bond would also be conceivable. A hybrid surface is defined as a surface consisting of at least two different materials. One of the two materials is generally limited to a small space while the second material surrounds the first material. For example, metal contacts are surrounded by dielectrics. When a hybrid bond is produced by the bonding of two hybrid surfaces, the bonding wave is driven mainly by the fusion bond between the dielectrics, while the metal contacts automatically meet by the bonding wave. Examples of dielectrics and low-k materials are non-silicon based
polymers
  polyimides
  aromatic polymers
  parylenes
  PTFE
amorphous carbon
silicon based
silicate based
TEOS (tetraethyl orthosilicate)
SiOF
SiOCH
Glasses (borosilicate glasses, aluminosilicate glasses, lead silicate glasses, alkali silicate glasses, etc.)
general
$Si_3N_4$
SiC
$SiO_2$
SiCN
Silsesquioxanes
HSSQ
MSSQ One of the greatest technical problems in permanent joining of two substrates is the alignment accuracy of the functional units between the individual substrates. Although the substrates can be very precisely aligned to one another by alignment systems, during the bonding process itself, distortions of the substrates can occur. Due to the distortions which arise in this way, the functional units will not necessarily be correctly aligned to one another at all positions. The alignment accuracy at a certain point on the substrate can be the result of a distortion, a scaling error, a lens fault (magnification or reduction error), etc.

In the semiconductor industry, all subtopics which relate to these problems are subsumed under the term "overlay." A corresponding introduction to this topic can be found, for example, in: Mack, Chris. Fundamental Principles of Optical Lithography—The Science of Microfabrication. WILEY, 2007, Reprint 2012.

Each functional unit is designed in a computer before the actual production process. For example, printed circuits, microchips, MEMS, or any other structure which can be produced using microsystems technology, are designed in CAD (computer-aided design). During the production of the functional units, however, it is shown that there is always a deviation between the ideal functional units, which have been engineered on a computer, and the real ones, which have been produced in a clean space. The differences can be attributed mainly to limitations of hardware, i.e., engineering problems, but very often to physical limits. Thus, the resolution accuracy of a structure which is produced by a photolithographic process is limited by the size of the apertures of the photomask and the wavelength of the light used. Mask distortions are transferred directly into the resist. Linear motors of machines can only approach reproducible positions within a given tolerance, etc. Therefore, it is no wonder that the functional units of a substrate cannot be exactly equal to computer-engineered structures. All substrates, therefore, already have a not negligible deviation from the ideal state before the bonding process.

Figure 8:
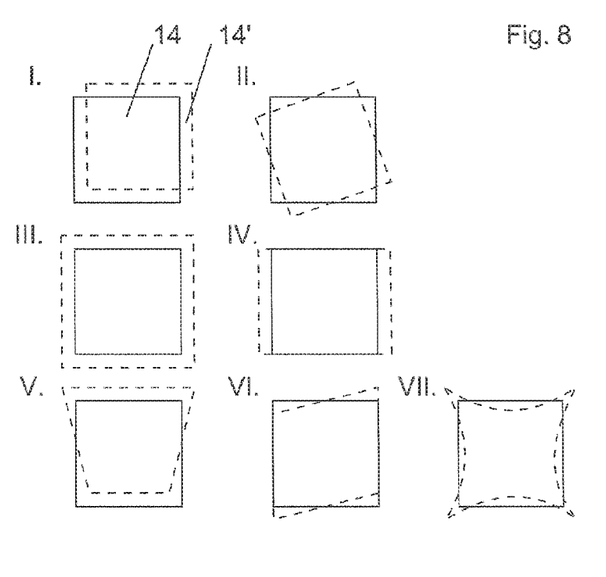

If the positions and/or forms of two opposite functional units of two substrates are compared, under the assumption that neither of the two substrates is distorted by a joining process, it has been found that generally there is imperfect congruence of the functional units since they deviate from the ideal computer model by the above-described faults. The most frequent faults are shown in FIG. 8 (copied from: http://commons.wikimedia.org/wiki/File: Overlay—typical model terms DE.svg 24.05.2013 and Mack, Chris. Fundamental Principles of Optical Lithography—The Science of Microfabrication. Chichester: WILEY, p. 312, 2007, reprint 2012). According to the figures, it can be roughly distinguished between global and local and symmetrical and asymmetrical overlay faults. A global overlay fault is homogenous, therefore, independent of site. It produces the same deviation between two opposing functional units regardless of the position. The classic global overlay faults are faults I and II, which form by a translation or rotation of the two substrates to one another. The translation or rotation of the two substrates produces a corresponding translational or rotational fault for all functional units which are opposite at the time on the substrates. A local overlay fault arises depending on the location, mainly by problems of elasticity and/or plasticity, in this case caused mainly by the continuously propagating bonding wave. Of the described overlay faults, mainly faults III and IV are call run-out faults. These faults arise mainly by a distortion of at least one substrate during a bonding process. The functional units of the first substrate with reference to the functional units of the second substrate are also distorted by the distortion of at least one substrate. Faults I and II can, however, also arise by a bonding process, but are generally so dramatically overlain by faults III and IV that they can only be recognized and measured with difficulty.

In the prior art, there is already a system by which local distortions can be at least partially reduced. It is a matter of local distortion due to use of active control elements (see WO2012/083978A1).

In the prior art, there are initial approaches to the correction of run-out faults. US20120077329A1 describes a method for obtaining a desired alignment accuracy between functional units of two substrates during and after bonding by the lower substrate not being fixed. In this way, the lower substrate is not subjected to boundary conditions and can bond freely to the upper substrate during the bonding process. An important feature in the prior art is primarily the flat fixing of a substrate, generally by means of a vacuum device.

The run-out faults which arise are more dramatic in most cases radially symmetrically around the contact site and, therefore, increase from the contact site to the periphery. In most cases, it is a linearly increasing intensification of the run-out faults. Under special conditions, the run-out faults can also increase nonlinearly.

Under especially optimum conditions, the run-out faults can be determined not only by corresponding measuring devices (see EP2463892), but can also be described by mathematical functions. Since the run-out faults constitute translations and/or rotations and/or scalings between well-defined points, they are preferably described by vector functions. Generally, this vector function is a function $f:R^2 \rightarrow R^2$, i.e., an imaging standard which images the two-dimensional definition region of the local coordinates onto the two-dimensional value range of run-out vectors. Although an exact mathematical analysis of the corresponding vector fields could not be done, assumptions are made with respect to the function properties. The vector functions are with great probability $c^n$ $n>=1$ functions, therefore, they are continuously differentiable at least once. Since the run-out faults increase from the contact-making point toward the edge, the divergence of the vector function will probably be different from zero. The vector field is therefore with great probability a source field.

An advantage of this invention is a device and a method for bonding of two substrates with which the bond precision, especially on the edge of the substrates, is increased.

This advantage is achieved with the features of the claimed invention. Advantageous developments of the invention are given in the dependent claims. All combinations of at least two of the features given in the specification, the claims and/or in the figures fall within the scope of the invention. For given values ranges, values which lie within the indicated limits should be considered disclosed as boundary values and able to be claimed in any combination.

SUMMARY OF THE INVENTION

The invention is based on the idea that at least one of the two substrates, preferably the second and/or lower substrate, is deformed for alignment of the contact surfaces solely outside the bond initiation site before and/or during the bonding, particularly during the travel of a bonding wave, preferably in fusion bonding. Deformation means a state which deviates from an initial state, i.e., the initial geometry of the substrates. As claimed in the invention, the bonding is initiated after contact-making of the contact surfaces by allowing the first/upper substrate to fall or by detaching it. Corresponding bonding means are provided according to the device.

In the initial state, the substrates on the contact surface are generally more or less flat, aside from any structures which project above the contact surface (microchips, functional components) and substrate tolerance, such as bending and/or thickness fluctuations. In the initial state, the substrates have a curvature different from zero in most cases. For a 300 mm wafer, curvatures of less than 50 μm are common. Viewed mathematically, a curvature can be regarded as a measure for the local deviation of a curve from its planar state. In this respect, substrates are examined whose thicknesses are small compared to the diameter. Therefore, in a good approximation, the curvature of a plane can be addressed. In the case of a plane, the initially mentioned flat state is the tangential plane of the curve at the point at which the curvature is being examined. Generally, a body, in the special case the substrate, does not have a homogeneous curvature so that the curvature is an explicit function of the site. Thus, it can be, for example, that a nonplanar substrate in the center has a concave curvature, at other sites, however, a convex curvature. Subsequently, in the simplest case, curvatures are only ever described as concave or convex without going into greater mathematic details, which are known to mathematicians, physicists and engineers.

A basic concept for most embodiments as claimed in the invention is comprised mainly in that the radii of curvature of two substrates to be bonded to one another are the same at least in the contact-making region of the substrates, i.e., on one bond front of the bonding wave or on the bond line, or at least deviate only marginally from one another. The difference of the two radii of curvature on the bond front/bond line of the substrates is therefore smaller than 10 m, preferably smaller than 1 m, more preferably smaller than 1 cm, most preferably smaller than 1 mm, still more preferably smaller than 0.01 mm, most preferably of all smaller than 1 μm. Generally, all embodiments which minimize the radii of curvature R1 are advantageous. In other words, the invention relates to a method and a system by which it is possible to bond two substrates to one another such that their local alignment faults, which are called run-out faults, become minimum. The invention is furthermore based on the idea of controlling the two substrates which are to be bonded to one another by geometric, thermodynamic and/or mechanical compensation mechanisms such that the factors influencing the forming bonding wave are chosen such that the two substrates do not shift locally to one another, and therefore, are correctly aligned. Furthermore, the invention describes an article comprised of two substrates which have been bonded to one another with a run-out fault which has been reduced as claimed in the invention.

One process which is characteristic in bonding, especially permanent bonding, preferably fusion bonding, is the point contact-making of the two substrates which is as centric as possible. Generally, the contact-making of the two substrates can also take place non-centrically. The bonding wave propagating from a non-centric contact point would reach different locations of the substrate edge at different times. The complete mathematical-physical description of bonding wave behavior and the resulting run-out fault compensation would be correspondingly complicated. But generally, the contact-making point will not be far from the center of the substrate so that the possibly resulting effects are negligible at least on the edge. The distance between a possible non-centric contact-making point and the center of the substrate is smaller than 100 mm, preferably smaller than 10 mm, more preferably smaller than 1 mm, most preferably smaller than 0.1 mm, most preferably of all smaller than 0.01 mm. In the following description, contact-making generally means centric contact-making. In a wider sense, the center is preferably defined as the geometrical center point of an underlying ideal body, compensated by asymmetries, if necessary. In commercial wafers with a notch, the center is therefore the midpoint of a circle, which surrounds the ideal wafer without a notch. In commercial wafers with a flat (flattened side), the center is the midpoint of the circle which surrounds the ideal wafer without a flat. Analogous considerations apply to substrates of any shape. In special embodiments, it can useful to define the center of gravity of the substrate as the center. In order to ensure exact, centric, point contact-making, an upper mounting apparatus (substrate holder) having a centric hole and a pin which can be moved by translation in the hole is provided with a radially symmetrical fixing. The use of a nozzle, which uses a fluid, such as a gas instead of the pin to apply pressure, would also be conceivable. Furthermore, the use of these components can even be completely abandoned when devices are provided which can move the two substrates toward one another by a translation movement, under the assumption that at least one of the two substrates, preferably the upper substrate, has an impressed curvature due to gravitation in the direction of the other substrate and therefore, in the mentioned translational approach to one another, at a relatively small distance to the corresponding second substrate, automatically makes contact.

The radially symmetrical fixing is either attached vacuum holes, a round vacuum lip, or comparable vacuum elements, by which the upper wafer can be fixed. The use of an electrostatic mounting apparatus is also conceivable. The pin in the centric hole of the upper substrate holder is used for controllable deflection of the fixed upper substrate.

After completed contact-making of the centers of the two substrates, the fixing of the upper substrate holder is released. The upper substrate drops on the one hand due to gravity and, on the other hand, due to a bond force acting along the bonding wave and between the substrates. The upper substrate is connected radially to the lower substrate from the center to the side edge. Thus, formation of a radially symmetrical bonding wave, which runs from the center to the side edge, occurs. During the bonding process, the two substrates press the gas present between the substrates, i.e., air, in front of the bonding wave, and thus provide for a bond boundary surface without gas inclusions. The upper substrate lies essentially on a type of gas cushion while dropping.

The first/upper substrate, after initiation of the bond at one bond initiation site, is not subject to additional fixing, therefore aside from the fixing at the bond initiation site, the first/upper substrate can move freely and can also be distorted. Each circle segment, which is infinitesimally small with respect to its radial thickness, will be subjected to a distortion by the bonding wave which is advancing the stress states which occur on the bonding wave front, and the existing geometrical boundary conditions. But since the substrates represent rigid bodies, the distortions add up as a function of the distance from the center. This leads to run-out faults which are to be eliminated by the method and the device as claimed in the invention.

Thus, the invention also relates to a method and a device for reducing, or even entirely avoiding, the run-out fault between two bonded substrates, especially by thermodynamic and/or mechanical compensation mechanisms during bonding. Furthermore, the invention treats a corresponding article which is produced with the device and the method as claimed in the invention.

In a first embodiment of the invention, the first, i.e., the lower, receiving or mounting apparatus on the receiving or mounting surface for receiving the first substrate is ground and/or polished and/or lapped convexly or concavely. Preferably, the mounting apparatus is convexly ground so that a substrate fixed on it is curved in the direction of the contact-making point or the bond initiation site.

A radius of curvature of the first and/or second receiving surfaces is especially greater than 0.01 m, preferably greater than 0.1 m, more preferably greater than 1 m, still more preferably greater than 10 m, most preferably greater than 100 m, most preferably of all greater than 1000 m. In one special embodiment, the radius of curvature of the first/lower receiving apparatus is the same size, especially within the same order of magnitude of one power of ten, as the radius of curvature of the second/upper substrate produced by the second/upper receiving or mounting apparatus by actuating means, especially a pin. This results in an initial position which is symmetrical with respect to the geometry for bonding.

It is advantageous if the first/lower receiving surface is ground such that the physical asymmetry is corrected by the gravitational field acting normally on the mounting surface such that the bonding wave front is always moving within the same horizontal plane.

The first and/or second substrate is preferably radially symmetrical. Although the substrate can have any diameter, the wafer diameter is especially 1 inch, 2 inches, 3 inches, 4 inches, 5 inches, 6 inches, 8 inches, 12 inches, 18 inches or larger than 18 inches. The thickness of the first and/or second substrate is preferably between 1 μm and 2000 μm, preferably between 10 μm and 1500 μm, more preferably between 100 μm and 1000 μm.

In special embodiments, a substrate can have a rectangular shape or at least one which deviates from a round shape. Hereinafter, a substrate is defined as a wafer.

In a second embodiment of the lower/first mounting apparatus, the radius of curvature of the lower/first mounting surface is adjustable. In one simple embodiment, the lower mounting apparatus has a support plate which is thick enough to not be deformed by unwanted external influences, but which has been produced to be thin enough to be brought into a convex or concave shape by a controlled force which is acting from underneath. In particular, the support plate has a bending stiffness of greater than $10^{-7}$ Nm$^2$, preferably greater than $10^{-3}$ Nm$^2$, more preferably greater than 1 Nm$^2$, still more preferably greater than $10^3$ Nm$^2$, most preferably of all greater than $10^7$ Nm$^2$. According to one embodiment of the invention, an interior part of the lower/first mounting apparatus is comprised of a highly elastic membrane which can be expanded and/or contracted pneumatically and/or hydraulically and/or piezoelectrically. The pneumatic and/or hydraulic and/or piezoelectric elements are preferably uniformly distributed and can be triggered individually.

In another embodiment, the lower/first mounting apparatus is made such that the lower/first substrate is deformed, i.e., laterally compressed or expanded, in a controlled manner by heating and/or cooling means even before contact-making, by the amount which is necessary in later contact-making to best, ideally completely, compensate for the run-out fault which arises. Since the fixing of the lower/first substrate in this embodiment only takes place after corresponding deformation, a special value need not be imposed on the coefficient of thermal expansion of the lower/first substrate or the lower/first mounting apparatus.

In another special procedure, the contact-making of the lower/first substrate takes place prior to a heating and/or cooling process. By fixing prior to the heating and/or cooling process, the lower/first substrate follows the thermal expansion of the lower/first mounting apparatus so that its coefficient of thermal expansion can be used to dictate the (thermal) expansion of the substrate. Preferably, the coefficients of thermal expansion of the lower/first substrate and the lower/first mounting apparatus are the same so that in the heating and/or cooling process no thermal stresses, or at least small thermal stresses, arise in the lower/first substrate. It would also be conceivable for the coefficients of thermal expansion to be different. In the case of different coefficients of thermal expansion, the lower/first substrate in the middle will follow the thermal expansion of the lower/first mounting apparatus.

The temperature difference to be set between the first and second mounting apparatus are less than 20° C., preferably less than 10° C., more preferably less than 5° C., most preferably less than 2° C., most preferably of all less than 1° C. Each mounting apparatus is heated through as homogeneously as possible. In particular, there is a temperature field whose temperature difference at any two points is smaller than 5° C., preferably smaller than 3° C., more preferably smaller than 1° C., most preferably smaller than 0.1° C., most preferably of all smaller than 0.05° C.

In another embodiment, the first mounting apparatus is designed such that the mounting apparatus on the mounting surface can be deformed, compressed and/or expanded, in a controlled manner by mechanical actuating means. The first substrate, which is fixed on the surface of the first mounting apparatus, is deformed due to its small thickness with reference to the mounting apparatus by the deformation of the mounting apparatus. The mounting apparatus is deformed with pneumatic and/or hydraulic and/or piezoelectric actuators which have been arranged distributed around the substrate mount, preferably radially and symmetrically. For a completely symmetrical, purely radial distortion, at least three actuators are needed which are arranged at an angular distance of 120°. Preferably, more than 5 actuators, more preferably more than 10 actuators, preferably more than 20 actuators, still preferably more than 30 actuators, most preferably of all more than 50 actuators are used.

In another embodiment, the contact surfaces of the two substrates are bonded to one another in a vertical position. The task of this embodiment is comprised mainly in reducing the deformation of the wafers by gravitation, i.e., preferably arranging them at least symmetrically, and entirely preventing and/or compensating for a deformation by gravitation. Preferably, in the vertical position, the two substrates are curved at the same time symmetrically to the bond initiation site by one actuating means each, in particular one pin each, toward the bond initiation site so that the convex surfaces can make contact in the bond initiation site. The automatic bonding process with a bonding wave is started by detaching at least one of the substrates from the mounting surface.

The embodiments as claimed in the invention are preferably operated in a defined, especially controllable atmosphere, especially under normal pressure.

All mentioned embodiments can be implemented in one special version in a low vacuum, more preferably in a high vacuum, still more preferably in an ultrahigh vacuum, in particular with a pressure of less than 100 mbar, preferably less than $10^{-1}$ bar, more preferably less than $10^{-3}$ bar, still more preferably less than $10^{-5}$ bar, most preferably less than $10^{-8}$ bar.

In a further embodiment, at least one factor influencing the propagation, in particular the propagation velocity, of the bonding wave and/or at least one factor influencing the alignment of the contact surfaces, is controlled. The bonding wave is monitored with respect to its velocity. The velocity is controlled indirectly via the composition and/or the density and/or the temperature of a gas in the atmosphere in which bonding is done. Although the method is preferably to be carried out in a low pressure atmosphere, preferably in a vacuum, it can be advantageous to carry out the bonding process in another atmosphere, in particular in the range of the normal pressure. Due to the point contact, the bonding wave in the bonding always travels radially symmetrically from the center to the side edge, and in this process presses an annular gas cushion in front of it. Along the roughly circular ring-shaped bond line (bond front) of the bonding wave, such a large bond force prevails that inclusions of gas bubbles cannot arise at all. The upper/second substrate therefore lies on a type of gas cushion during the bonding process.

It is established by the selection of a gas/gas mixture and definition of the properties of the gas cushion how fast and how strongly the second substrate can be lowered and/or expanded. Furthermore, the velocity of the bonding wave can also be controlled via the properties of the gas.

The composition of the gas mixture is chosen according to another, independent aspect of the invention. Preferably, gases with types of atoms and/or molecules that are as light as possible and which have a correspondingly low inertia at a given temperature are used. Therefore, the molar mass at least of one of the gas components is less than 1000 g/mole, preferably less than 100 g/mole, more preferably less than 10 g/mole, most preferably of all less than 1 g/mole. More preferably, the density of the gas mixture used is set to be in particular as small as possible, and/or the temperature is set to be in particular as high as necessary. The gas density is set to be smaller than 10 $kg/m^3$, preferably smaller than 1 $kg/m^3$, more preferably smaller than 0.1 $kg/m^3$, most preferably smaller than 0.01 $kg/m^3$. The temperature of the gas is set to be greater than 0° C., preferably greater than 100° C., more preferably greater than 200° C., most preferably greater than 300° C., most preferably of all greater than 400° C. The aforementioned parameters are chosen such that the selected gas mixture or individual components of the gas mixture do not condense. In this way liquid inclusions on the surface of the substrates during the bonding process are avoided.

Analogous considerations apply to gas mixtures whose thermodynamic properties are shown in multicomponent phase diagrams. By changing the composition and/or pressure and/or temperature of the gas mixture, the kinematics of the first and/or second substrate is influenced and thus the run-out fault is also reduced.

Preferably, all variable parameters are chosen such that the bonding wave propagates with a velocity as optimum as possible with respect to the existing initial and boundary conditions. Mainly for an existing atmosphere, at normal pressure, a velocity of the bonding wave as slow as possible is advantageous. The velocity of the bonding wave is less than 200 cm/s, more preferably less than 100 cm/s, more preferably less than 50 cm/s, most preferably less than 10 cm/s, most preferably of all less than 1 cm/s. In particular, the velocity of the bonding wave is greater than 0.1 cm/s. In particular, the velocity of the bonding wave along the bond front is constant. In a vacuum environment, the velocity of the bonding wave automatically becomes faster since the substrates which are being joined along the bond line need not overcome any resistance by a gas.

According to another independent aspect of the invention, a stiffening plate is inserted between the mounting surface and the upper/second substrate on the upper/second mounting apparatus. The stiffening plate is temporarily bonded to the substrate and changes the behavior of the upper/second substrate during bonding. The connection between the stiffening plate and the upper/second substrate takes place by a construction-engineering fixing in the stiffening plate. The fixing is preferably vacuum fixing. Electrostatic fixings, very thin mechanical fixings which rechuck the substrates on the edge, and adhesion fixings by a highly polished stiffening plate surface would also be conceivable.

According to another independent aspect of the invention, the run-out fault is set by a very small distance between the two substrates prior to contact-making and/or outside the bond initiation site. The distance is in particular less than 100 μm, preferably less than 50 μm, more preferably less than 20 μm, most preferably less than 10 μm.

It is preferable that the radius of curvature of the two substrates, on the bond front, deviates by less than 5% from one another, more preferably is the same.

In another special development of all embodiments, the lower/first mounting apparatus and/or the upper/second mounting apparatus have as actuating means, such as centric holes and a pin, by which a convex curvature of the respective substrates can be effected in the direction of the bond initiation site.

The above described steps and/or movements and/or sequences, especially of the pins for deflection of the substrates, the approach of the substrates to one another, monitoring of the temperature, of the pressure and of the gas composition, are controlled preferably via a central control unit, i.e., a computer with control software.

The substrates can be received and fixed on a receiving or mounting apparatus in any conceivable manner with any known technology. Vacuum sample holders, electrostatic sample holders, sample holders with mechanical clamping, are in particular conceivable according to the invention. Preferably, the substrates are fixed solely on a circle segment which is as far as possible outside in the region of the side edge in order to afford the substrates maximum flexibility and freedom to expand within the fixing.

Another independent aspect of the invention comprises contact-making in a manner as coordinated as possible and at the same time quasi-independently by at least one of the substrates being exposed to a prestress. This prestress runs concentrically to the middle M of one contact surface of the substrate radially to the outside before contact-making. Then, only the start of contact-making is influenced. After contact-making of a section, in particular the middle M of the substrate, the substrate is released and bonds to the opposite substrate controlled automatically based on its prestress. The prestress is achieved by a deformation of the first substrate by deformation means. The deformation means, based on their shape, acting on the side facing away from the bond side and the deformation, is controllable by using different (especially interchangeable) deformation means. The control also takes place by the pressure or the force with which the deformation means act on the substrate. In this respect, it is advantageous to reduce the effective mounting surface of the mounting apparatus with the semiconductor substrate so that the semiconductor substrate is only partially supported by the mounting apparatus. In this way, the smaller contact surface yields smaller adhesion between the wafer and the sample holder or the mounting apparatus. Fixing is applied solely in the region of the periphery of the semiconductor substrate (first substrate) so that there is efficient fixing with an effective mounting surface simultaneously as small as possible between the mounting contour of the mounting apparatus and the semiconductor substrate. Thus, at the same time, gentle and reliable detachment of the semiconductor substrate is possible since the detachment forces necessary for detaching the wafer are as small as possible. The detachment is mainly controllable, by reducing the negative pressure on the mounting surface. "Controllable" means that after the contact of the wafer with a second wafer, the wafer on the sample holder remains still fixed and only by dedicated (controlled) reduction of the negative pressure on the mounting surface is a detachment of the substrate (wafer) from the sample holder (mounting apparatus) effected, from the inside to the outside. The embodiment as claimed in the invention leads mainly to the detachment being able to be effected by very small forces.

The substrates (wafers) are aligned to one another prior to the bonding process in order to ensure identical congruence (exact alignment, especially with a precision of less than 2 µm, preferably less than 250 nm, more preferably less than 150 nm, most preferably less than 100 nm) of corresponding structures on their surfaces. In the bond method according to the invention, the wafers are not placed flat on one another, but are brought into contact with one another first in the middle M by one of the two wafers being pressed lightly against the second wafer or being deformed accordingly in the direction of the opposite wafer. After detachment of the deformed (in the direction of the opposite wafer) deflected wafer, continuous and more uniform welding takes place which is at least largely automatic and which is associated with the minimum force and with the minimum mainly horizontal distortions along the bond front by the advance of a bonding wave.

Another independent aspect of the invention comprises controlling the deformation of the first substrate and/or of the second substrate depending on given factors influencing the travel of the bonding wave. The influencing factors include among others the ambient pressure of the atmosphere surrounding the substrates, the type of gas/gas mixture present in the atmosphere, the temperature, the distance between the substrates outside the bond initiation site, the bond strength of the substrates, any pretreatment steps, the composition of the surfaces, the surface roughness, the materials on the surface and the wafer thickness/bending strength.

To the extent the bond initiation site is located in the center of the contact surfaces of the substrates, uniform, concentric travel of the bonding wave can be accomplished.

It is advantageous if the deformation of the first substrate and/or of the second substrate takes place in the lateral direction and/or convexly and/or concavely, still more preferably mirror-symmetrically. In other words, the deformation takes place by expansion or compression or curving of the first substrate and/or of the second substrate.

Preferably, the substrates have roughly identical diameters D1, D2 which deviate from one another in particular by less than 5 mm, preferably less than 3 mm, still more preferably less than 1 mm.

According to another aspect of the invention, the deformation takes place by mechanical actuating means and/or by temperature control of the first and/or second mounting apparatus.

By the first substrate and/or the second substrate being fixed solely in the region of the side walls on the first and/or second mounting surfaces, the deformation as claimed in the invention can be accomplished more easily.

Features disclosed according to the device should also be considered as disclosed according to the method and vice versa.

Other advantages, features and details of the invention will become apparent from the following description of preferred exemplary embodiments using the drawings.

DETAILED DESCRIPTION OF THE PREFERRED EMBODIMENTS

In the figures, the same components and components with the same function are labeled with the same reference numbers.

Figure 1:
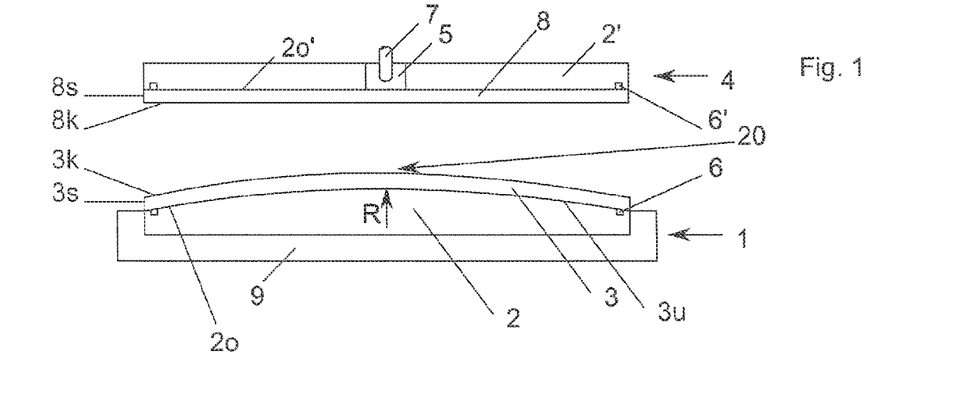
FIG. 1 shows a schematic cross section of a first embodiment of the device as claimed in the invention.

FIG. 1 shows a lower first mounting apparatus 1 as a substrate sample holder, which apparatus 1 is comprised of a base body 9 and a mounting body 2. The mounting body 2 has a first mounting surface 2o which is located to the top in the direction of an opposing second mounting apparatus 4. In the embodiment illustrated, first mounting surface 2o is convexly curved. The mounting body 2 is made interchangeable as a module and can be separated from the base body 9. The base body 9 is thus used as an adapter between the mounting body 2 and a lower mounting unit of the bonder (not shown). This makes it possible to carry out a prompt change between different modular mounting bodies 2 with different radii R of curvature if necessary.

On the mounting body 2, there are fixing means 6 in the form of vacuum paths with which a lower first substrate 3 can be fixed on the mounting surface 2o.

Since the radius of curvature R is preferably very large, and thus the curvature is essentially undetectable with the naked eye (the representation in the figures is highly exaggerated and schematic), it is to execute the first mounting apparatus without fixing means 6 and to finally place the first substrate on the mounting surface 2o. Adhesion by electrostatic, electrical or magnetic fixing means is also conceivable as claimed in the invention.

The second mounting apparatus 4, which is made as a substrate sample holder, is comprised of a base body 2' with a second mounting surface 2o' which can be aligned in particular in concentric sections equidistantly to corresponding concentric sections of the first mounting surface 2o.

The base body 2' has an opening 5 in the form of a hole and fixing means 6' similarly to the fixing means of the first mounting apparatus 1.

The fixing means 6' are used to fix an upper, second substrate 8 on one side facing away from the contact surface 8k of the second substrate 8.

Actuating means in the form of a pin 7 are used for deformation (here: deflection) and thus for the primarily point approach of the second substrate 8 to the curved first substrate 3, especially in the region of a curvature maximum.

In one special embodiment, it is conceivable to make the mounting body 2 of temperature-resistant and/or corrosion-resistant material to form a stretchable component which can be expanded and contracted pneumatically and/or hydraulically, in particular a pillow.

Figure 2:
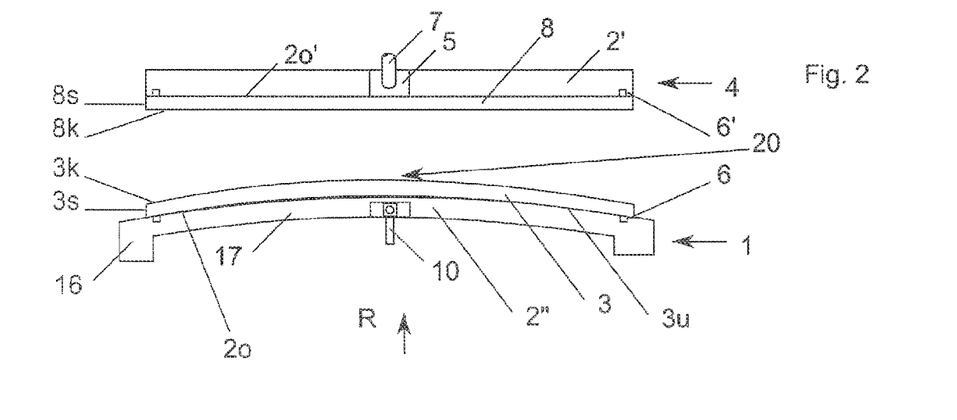
FIG. 2 shows a schematic cross section of a second embodiment of the device as claimed in the invention.

FIG. 2 shows a second embodiment with a mounting body 2" in which the first mounting surface 2o can be deformed in a controlled manner by an actuating element 10, which in the embodiment shown is a pull rod and/or push rod. The mount 2" has a concentrically running fixing section 16 and a deformation section 17 which encompasses the first mounting surface 2o. The deformation section 17 has at least predominantly a constant thickness and thus a predominantly constant bending stiffness. The actuating element 10 is located and fixed, on the actuating side of the deformation section 17 facing away from the mounting surface 2o. By means of the actuating element 10, the deformation section 17 can be deformed in the micrometer range and can be curved convexly and concavely. The actuating element 10 travels more than 0.01 µm, preferably more than +/−1 µm, more preferably more than +/−1 µm, still more preferably more than +/−100 µm, most preferably more than +/−1 mm, most preferably of all more than +/−10 mm. Otherwise, the embodiment according to FIG. 2 corresponds to the embodiment according to FIG. 1.

Figure 3:
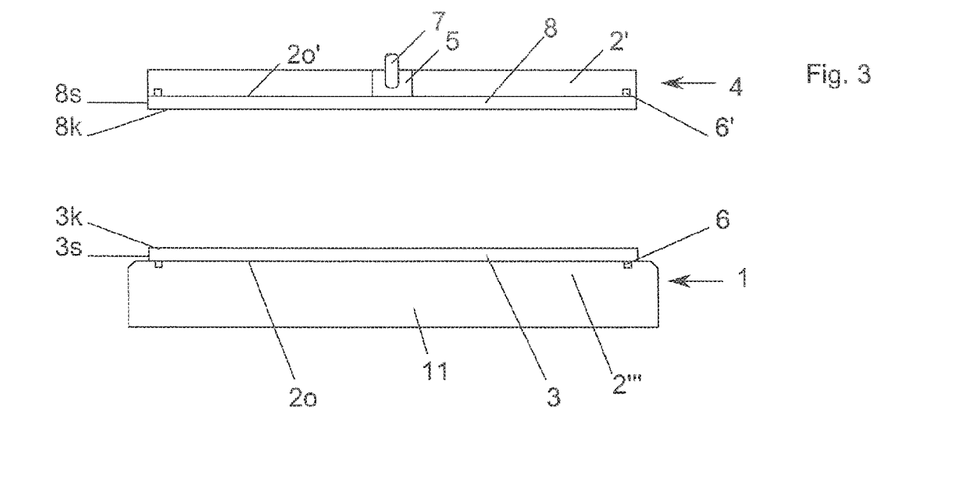
FIG. 3 shows a schematic cross section of a third embodiment of the device as claimed in the invention.

FIG. 3 shows a third embodiment with a first mounting apparatus 1 with a mounting body 2". The mounting body 2'" has the first mounting surface 2o for accommodating the first substrate 3. Furthermore, the first mounting apparatus 1 in this embodiment has temperature control means 11 for temperature control (heating and/or cooling) of the mounting body 2'" at least in the region of the first mounting surface 2o, and preferably the entire mounting body 2'".

In the first procedure, the first substrate 3 is fixed on the heated mounting body 2'" only after reaching its expansion which has been caused by the temperature difference. In this way, the first substrate 3 expands according to its own coefficient of thermal expansion.

In a second procedure, the first substrate 3 is fixed on the mounting body 2'" before thermal loading by the temperature control means 11. By changing the temperature control means 11, the mounting body 2'" and thus the first mounting surface 2o with the first substrate 3 fixed on it expand in the lateral direction. Preferably, the mounting body 2'" has essentially the same coefficient of thermal expansion as the first substrate 3. Otherwise, the third embodiment corresponds to the above-described first and second embodiments.

Figure 4:
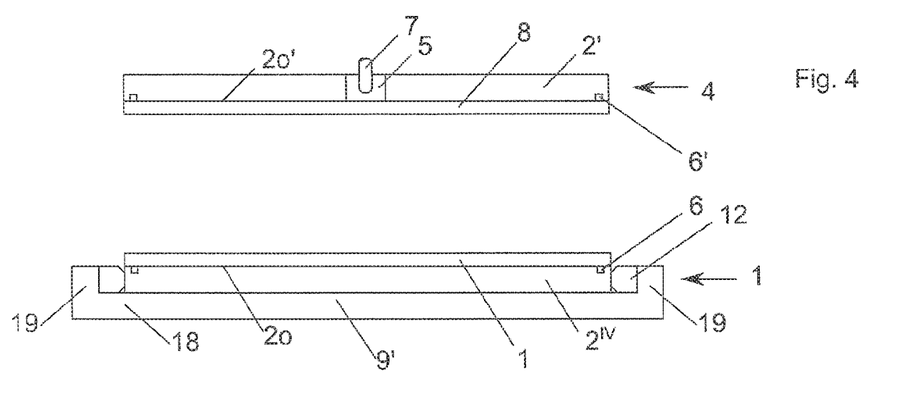
FIG. 4 shows a schematic cross section of a fourth embodiment of the device as claimed in the invention.

FIG. 4 shows a fourth embodiment with a base body 9' with a mounting section 18 for accommodating a mounting body 2$^{IV}$. The base body 9' comprises a shoulder section 19 which adjoins the mounting section 18 and which is made circumferential. The shoulder section 19 is used as a stop for actuating elements 12, which are used for deformation of the mounting body 2$^{IV}$ in the lateral direction. The actuating elements 12 in the form of plurality of pulling and/or pushing elements 12 are arranged and distributed on the lateral periphery of the mounting body 2$^{IV}$. The actuating elements 12 are used for deformation of the mounting body 2$^{IV}$ in the lateral direction, by mechanical expansion and/or compression, preferably in the micrometer range. The mounting body 2$^{IV}$ is expanded/compressed by more than 0.01 µm, preferably more than +/−1 µm, more preferably more than +/−1 µm, still more preferably more than +/−100 µm, most preferably more than +/−1 mm, most preferably of all more than +/−10 mm. The actuating elements 12 can be made as purely mechanical and/or pneumatic and/or hydraulic and/or piezoelectric components.

Otherwise, the fourth embodiment corresponds to the above described first, second and third embodiments. In the fourth embodiment it is especially important that the adhesion between the substrate 1 and the mounting body 2$^{IV}$ is so great that the substrate 1 during elongation or compression of the mounting body 2$^{IV}$ is likewise accordingly elongated or compressed by the actuating elements 12.

Figure 5:
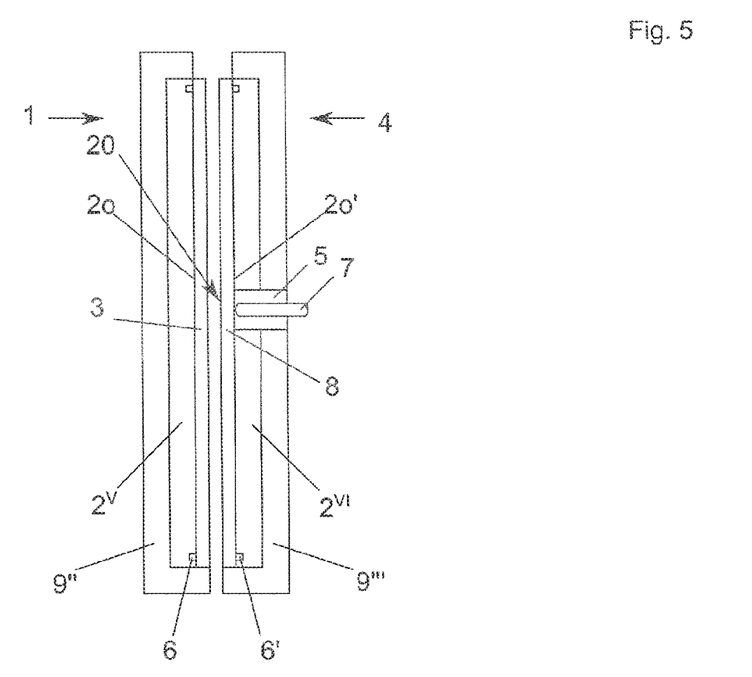
FIG. 5 shows a schematic cross section of a fifth embodiment of the device as claimed in the invention.

FIG. 5 shows a fifth embodiment in which the first mounting apparatus 1 and the second mounting apparatus 4 are vertically aligned. The first mounting apparatus 1 has a base body 9'" and a mounting body 2$^{V}$ which is fixed by the base body 9'". The mounting body 2$^{V}$ encompasses the first mounting surface 2o which is located vertically in this embodiment and on which the first substrate 3 is fixed via fixing elements 6.

The second mounting apparatus 4 encompasses a base body 9'" which is located oppositely for accommodating and fixing a mounting body 2$^{VI}$. The mounting body 2$^{VI}$ is used to accommodate and fix the second substrate 8 on its vertically arranged mounting surface 2o'. For deformation of the second substrate 8, an opening 5 (analogous to opening 5 according to FIG. 1) with an actuating means in the form of a pin 7 is provided. Pin 7 is made to deform the second substrate 8 through the opening 5, specifically on one side facing away from the contact surface 8k of the second substrate 8. The pin 7 defines a bond initiation site 20 when the substrates 3, 8 make contact by deformation of the second substrate 8.

Aside from the opening 5 and the pin 7, the first mounting apparatus 1 and the second mounting apparatus 4 are made symmetrical in the embodiment according to FIG. 5. Preferably, the first mounting apparatus also has a corresponding opening and a corresponding pin so that a symmetrical deformation of the substrates 3, 8 is enabled. By simultaneously releasing the fixing means 6, 6' after the deformed substrates 3, 8 make contact at a bond initiation site 20 which is located in particular in the center of the substrates 3, 8, the substrates 3, 8 behave identically so that even for the lack of an influence of a gravitational force on the deformation in the direction of the contact surfaces 3k, 8k onto one another no alignment faults occur during the advance of the bonding wave. This applies when the predominant number of factors, which influence the bonding wave or alignment faults, i.e., the thickness of the substrates or the bending stiffness of the substrates, is the same. The bending stiffness is the resistance which a body opposes to bending impressed on it. The higher the bending stiffness, the greater the bending moment must be to achieve the same curvature.

The bending stiffness is a pure material and geometrical property which is independent of the bending moment (assuming that the bending moment does not change the moment of inertia by a change in the cross section). The cross section of a wafer through its center is a very good approximation of a rectangle with a thickness t3 and wafer diameter D. The bending stiffness is the product of the modulus of elasticity and the planar moment of inertia for homogeneous cross sections. The planar moment of inertia of a rectangle around an axis normal to the thickness would be directly proportional to the third power of the thickness. Therefore, the moment of inertia and thus the bending moment are influenced by the thickness. The bending moment arises by the action of the gravitational force along the substrate. For a constant bending moment, e.g., a constant gravitational force, substrates with greater thicknesses due to their greater bending moments are less curved than substrates with lower thicknesses.

Figure 6:
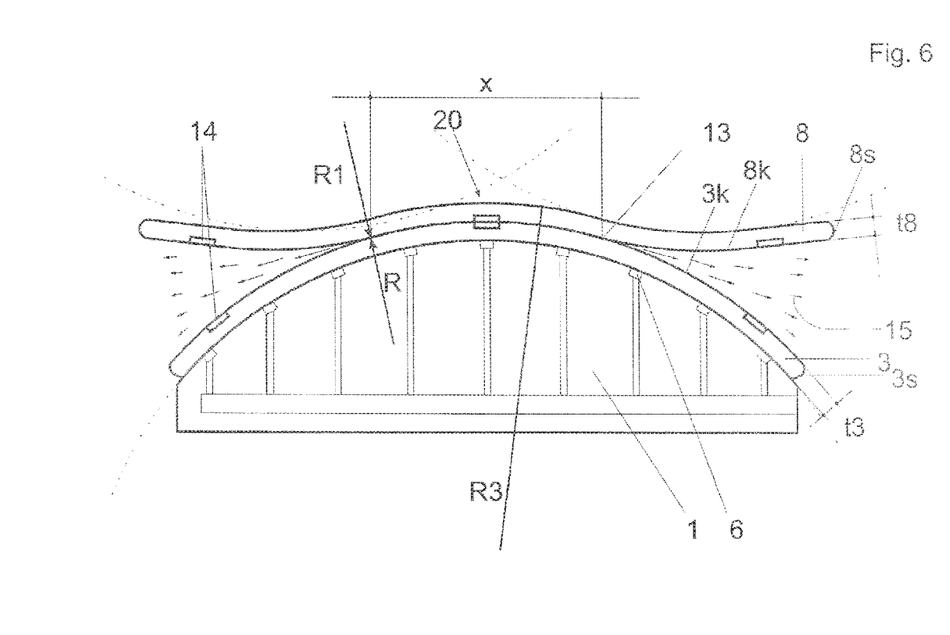
FIG. 6 shows a schematic of the method step of bonding as claimed in the invention.

FIG. 6 schematically shows the bonding process, wherein a radius R of curvature of the first mounting apparatus 1 is shown highly exaggerated for illustration purposes. The radius of curvature is several meters at diameters of the substrates 3, 8 in the range from 1 inch to 18 inches and thicknesses of the substrates 3, 8 in the range from 1 µm to 2000 µm.

After contact-making of the substrates 3, 8 on contact surfaces 3k, 8k in the region of the bond initiation site 20, which site 20 lies in the center of the substrates 3, 8, and after cancellation of the fixing (release) of the second substrate 8 from the second mounting apparatus 4, bonding begins. A bonding wave with a bond front 13 runs concentrically from the bond initiation site 20 to the side edges 8s, 3s of the substrates 3, 8.

In doing so, the bonding wave displaces the gas 15 (or gas mixture 15) which is shown by arrows between the contact surfaces 3k, 8k.

The substrate 3 is deformed by the mounting apparatus 1 such that the alignment faults of corresponding structures 14 of the substrates 3, 8 are minimized.

The substrate 8 deforms during travel of the bonding wave (after bond initiation and release from the mounting apparatus 4) based on the acting forces: gas pressure, gas density, velocity of the bonding wave, weight, natural frequency (spring behavior) of the substrate 8.

In the illustrated exemplary embodiment which corresponds to the first two embodiments according to FIGS. 1 and 2, the deformation takes place by curvature of the substrates 3, 8, a radius R of curvature of the upper substrate 8, especially at each instant on the bond front 13, corresponding essentially to the radius R1 of curvature of the lower substrate 3. If one of the two mounting surfaces 2o, 2o' is flat and thus also the radius of the corresponding substrate 3 or 8 which is supported on the flat mounting surface 2o or 2o' is infinitely large, the radius of the correspondingly opposite substrate 8 or 3 is set to be correspondingly large, in the boundary case infinitely large. Thus, inventive compensation of the run-out fault by two substrates 3 and 8 approaching one another, whose radii of curvature are infinitely large, therefore whose contact surfaces 3k, 8k are parallel to one another, is also disclosed. This inventive special case would be suitable mainly in a vacuum environment in order to join the two substrates 3 and 8 to one another since it would not be necessary to bond the two substrates 3 and 8 to one another by a bonding wave which is pushing an amount of gas in front of it out of the bond interface and which is propagating from the bond center. The difference of the radii R1 and R of curvature is especially smaller than 100 m, preferably smaller than 10 m, more preferably smaller than 1 m, most preferably smaller than 1 cm, most preferably of all smaller than 1 mm.

It is conceivable to control the atmosphere by choosing the gas 15 or the gas mixture 15 and the pressure and/or the temperature the bond velocity.

Figure 7A:
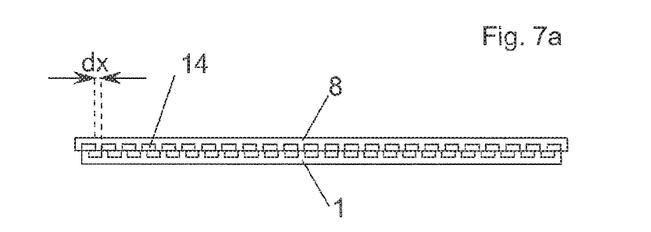
FIG. 7a shows a schematic of a bonded substrate pair with an alignment fault dx in the region of one side edge of the substrates.
Figure 7B:
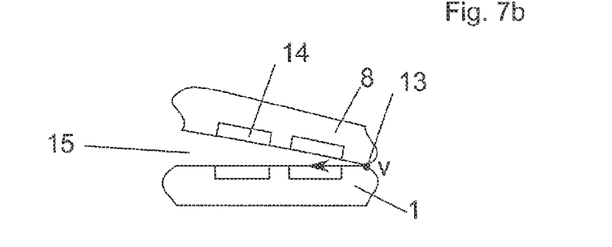
FIG. 7b shows a schematic enlargement of two substrates in the region of a bonding wave as claimed in the invention.
Figure 7C:
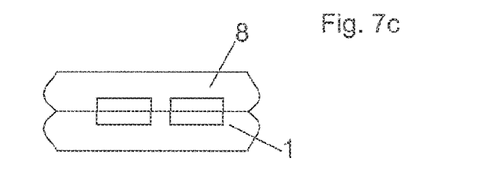
FIG. 7c shows a schematic enlargement of two substrates without alignment faults/run-out faults.
Figure 7D:
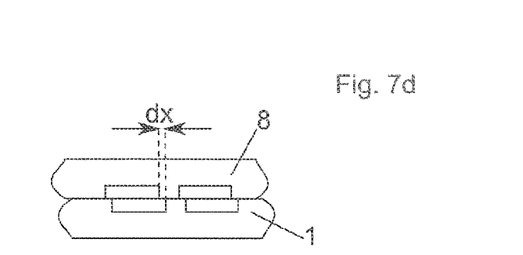
FIG. 7d shows a schematic enlargement of two substrates with alignment faults/run-out faults and FIG. 8 shows a symbolic representation of the possible overlay or run-out fault.

FIGS. 7a to 7d illustrate in enlarged form possible alignment faults dx according to FIGS. 7a and 7d, which as claimed in the invention according to FIGS. 7b and 7c are at least predominantly eliminated by the deformation of the substrates 3, 8.

The described method steps, especially movements and parameters, are controlled by an especially software-supported control apparatus (not shown).

REFERENCE NUMBER LIST 1 first receiving/mounting apparatus
2, 2', 2", 2'", $2^{IV}$, $2^{V}$, $2^{VI}$ receiving/mounting body
2o first receiving/mounting surface
2o' second receiving/mounting surface
3 first substrate
3k first contact surface
3s side edge
4 second receiving/mounting apparatus
5 opening
6, 6' fixing means
7 pin
8 second substrate
8k second contact surface
8s side edge
9, 9', 9", 9'" base body
10 actuating element
11 temperature control means
12 actuating element
13 bond front
14, 14' structure
15 gas/gas mixture
16 fixing section
17 deformation section
18 mounting section
19 shoulder section
20 bond initiation site
dx alignment fault
d1, d2 diameter
R, R1 radius of curvature Having described the invention, the following is claimed:
1. A device for bonding of a first substrate to a second substrate on respective contact surfaces of the substrates, the device comprising:
    a first mounting apparatus configured to accommodate the first substrate on a first mounting surface, the first mounting apparatus being a lower mounting apparatus;
    a second mounting apparatus configured to accommodate the second substrate on a second mounting surface the second mounting apparatus being an upper mounting apparatus;
    contact means for bringing the contact surface of the first substrate into contact with the contact surface of the second substrate at a bond initiation site;
    fixing means for fixing the first substrate and/or the second substrate solely in a region of side edges of the substrates on the first and/or second mounting surfaces; and
    deformation means for deforming the first substrate and/or the second substrate for alignment of the contact surfaces outside the bond initiation site before and/or during the bonding, the deformation means comprising mechanical actuating means configured to mechanically actuate the first and/or second mounting apparatus, the mechanical actuating means comprising an actuating element of the first mounting apparatus, the actuating element being configured to actuate the first mounting surface of the first mounting apparatus to adjust a radius of curvature of the first mounting surface of the first mounting apparatus,
    wherein a radius of curvature of the first substrate and a radius of curvature of the second substrate deviate only marginally from each other at least in a region at which the contact surfaces are brought into contact at a bond front of a bonding wave.

2. The device as claimed in claim 1, wherein the radii of curvature of the substrates deviate from each other at the bond front less than 5%.

3. The device as claimed in claim 1, wherein the radii of curvature of the substrates are the same at the bond front.

4. The device as claimed in claim 1, wherein the deformation means is configured to encompass the first mounting apparatus, and
   wherein the first mounting apparatus is deformable on the first mounting surface in a lateral direction, convexly, concavely, or in a combination of one or more thereof.

5. The device as claimed in claim 1, wherein the deformation means is configured encompass the second mounting apparatus, and
   wherein the second mounting apparatus is deformable on the second mounting surface in a lateral direction, convexly, concavely, or in a combination of one or more thereof.

6. The device as claimed in claim 1, wherein the mechanical actuating means further comprises a pin of the second mounting apparatus, the pin being configured to mechanically actuate the second substrate to adjust the radius of curvature of the second substrate.

7. The device as claimed in claim 1, wherein the actuating element comprises a pull rod and/or a push rod configured to actuate the first mounting surface of the first mounting apparatus to adjust a radius of curvature of the first mounting surface of the first mounting apparatus.

\* \* \* \* \*